United States Patent
Schaller et al.

(10) Patent No.: US 6,202,293 B1
(45) Date of Patent: Mar. 20, 2001

(54) WORK HOLDER ASSEMBLY

(75) Inventors: Alfred Schaller, N. Wales; Glenn Alan Quier, Hellertown, both of PA (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/494,220

(22) Filed: Jan. 28, 2000

(51) Int. Cl.[7] ............................. B23P 19/00; B23Q 15/00
(52) U.S. Cl. ............................. 29/760; 29/740; 29/832; 228/9; 737/209
(58) Field of Search ............................. 29/760, 740, 832, 29/840, 281.1, 281.4; 269/71, 237; 228/212, 9, 102, 4.5, 180.5, 110.1, 1.1, 6.2, 49.5; 437/209, 214

(56) References Cited

U.S. PATENT DOCUMENTS

| | | | |
|---|---|---|---|
| 4,078,302 | * | 3/1978 | Fok et al. ............................. 29/741 |
| 4,159,565 | * | 7/1979 | Schwalm ............................. 29/759 |
| 4,752,025 | * | 6/1988 | Stach et al. ............................. 228/9 |
| 4,789,096 | | 12/1988 | Dunn et al. . |
| 5,057,969 | | 10/1991 | Ameen et al. . |
| 5,115,964 | | 5/1992 | Ameen et al. . |
| 5,232,532 | * | 8/1993 | Hori ............................. 156/163 |
| 5,436,202 | * | 7/1995 | Miura ............................. 437/209 |
| 5,472,135 | | 12/1995 | Taniguchi et al. . |
| 5,553,768 | * | 9/1996 | Lasto et al. ............................. 228/102 |
| 5,831,160 | * | 11/1998 | Steketee ............................. 73/431 |
| 6,086,641 | * | 7/2000 | Shironouchi ............................. 29/25.01 |
| 6,115,909 | * | 9/2000 | Miller ............................. 29/740 |
| 6,142,356 | * | 11/2000 | Yamazaki et al. ............................. 228/6.2 |

FOREIGN PATENT DOCUMENTS

| | | | |
|---|---|---|---|
| 64-2400 | * | 1/1989 | (JP) ............................. 29/740 |
| 157599 | * | 6/1989 | (JP) ............................. 29/740 |
| 241889 | * | 9/1989 | (JP) ............................. 29/740 |

* cited by examiner

Primary Examiner—Carl J. Arbes
Assistant Examiner—Minh Trinh
(74) Attorney, Agent, or Firm—John Kajander

(57) ABSTRACT

A work holder assembly is provided for bonding wire to an electronic component in a package. The work holder assembly includes a base having a front wall and a back wall extending between a first end and a second end. The work holder assembly includes a fixture for removably securing the package to the base and a linear slide extending between the first and second ends of the base for moving the fixture between a wire bonding position, a heating position and a load/unload position. The work holder assembly also includes a gas heater supported by the base for directing heated gas onto the package when the fixture is in the heating position and a fixture heated connected to the fixture for heating and maintaining the fixture at a predetermined fixture temperature. The work holder assembly further includes a first temperature controller connected to the base for actuating the heater to direct the heated gas onto the package when the fixture is in the heating position and a second temperature controller for continuously heating the fixture to maintain the predetermined fixture temperature during the bonding of wire to the electronic components when the fixture is in the wire bonding position. The work holder assembly includes a programmable logic controller for automatically moving the fixture along the linear slide between the heating position and the wire bonding position and for maintaining the fixture in each of the heating position and the wire bonding position for a predetermined period of time.

17 Claims, 2 Drawing Sheets

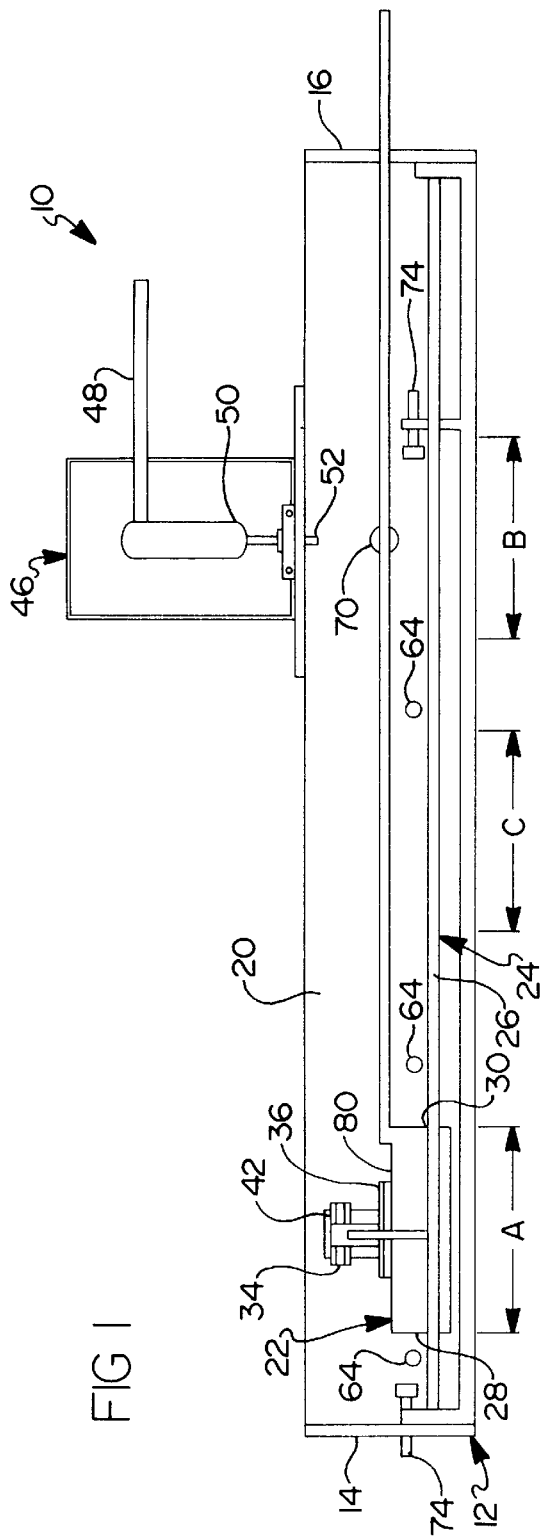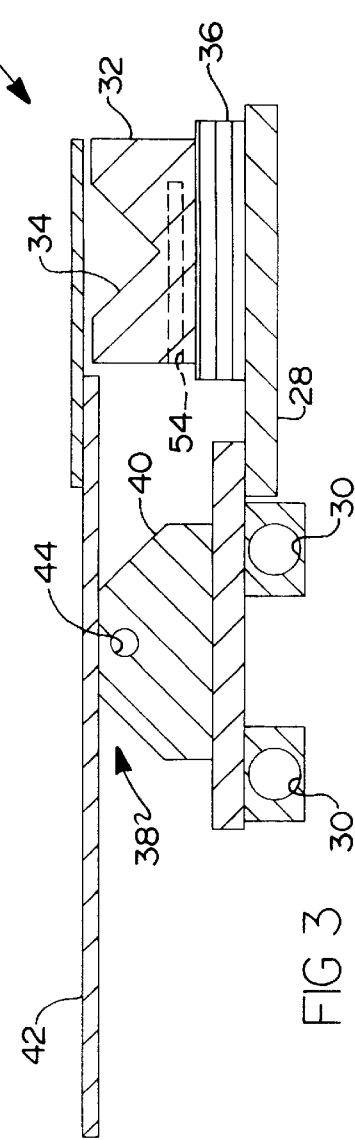

WORK HOLDER ASSEMBLY

BACKGROUND OF THE INVENTION

1. Field of the Invention

The present invention relates generally to a work holder assembly for bonding wire to an electronic component in a package.

2. Description of the Related Art

Electronic components are commonly formed by semiconductor chips having electrical contacts mounted onto a plastic package substrate having conductive elements forming a circuit board. The electrical contacts of the chip must be connected to the conductive elements of the package substrate to complete the circuit. It is common to solder, or wire bond, the electrical contacts with the conductive elements to complete the circuit of the electronic component. Some wire bonding processes require the electronic components to be bonded at high temperatures such as 150 degrees Celsius or higher. The components must also be held rigidly in place during the wire bonding process. One common process includes heating the package substrate in a furnace, or oven, for times ranging from 4 to 15 minutes, then transferring the package substrate to a heated wire bonding fixture for the wire bonding process. However, due to the poor thermal heat characteristics of the package and fixture, the package must often times be reheated in the wire bonding fixture to bring the package up to the specified temperature range for the wire bonding process.

Therefore, it is desirable to provide a work holder which can support the package on a continuously heated wire bonding fixture and transport the heated fixture between a heating position for directing heated gas onto the package and a wire bonding position for bonding the wire to the package.

SUMMARY OF THE INVENTION

Accordingly, the present invention is a work holder assembly for bonding wire to an electronic component in a package. The work holder assembly includes a base extending longitudinally between a first end and a second end. The work holder assembly further includes a fixture for removably securing the package to the base. The work holder assembly includes a linear slide extending between the first end and the second end of the base with the fixture coupled to the linear slide and moveable between a wire bonding position and a heating position. The work holder assembly also includes a gas heater operatively coupled to the base for directing heated gas onto the package in the heating position and a fixture heater operatively coupled to the fixture for heating and maintaining the fixture at a predetermined fixture temperature. The work holder assembly additionally includes a first temperature controller operatively connected to the base for actuating the heater to direct the heated gas onto the package in the heating position and a second temperature controller operatively connected to said base for actuating and heating the fixture to said predetermined fixture temperature for bonding wire to the electronic component in the package in the wire bonding position.

One advantage of the present invention is the work holder assembly positions the package, secured to the fixture, in both the heating position for directly applying heated gas to the package for a predetermined, programmed, period of time and the wire bonding position for bonding wire to the package. Another advantage of the present invention is the work holder assembly continues to heat the fixture to maintain a temperature range in the package during the wire bonding process.

Additionally, room temperature wire bonding processes, such as aluminum wire bonding, may be accomplished with the work holder assembly by simply turning off the heating mechanisms.

Other features and advantages of the present invention will be readily appreciated as the same becomes better understood after reading the subsequent description when considered in connection with the accompanying drawings.

BRIEF DESCRIPTION OF THE DRAWINGS

FIG. 1 is a side view of a work holder assembly, according to the present invention.

FIG. 3 is a side view of the fixture of the work holder assembly of FIGS. 1 and 2.

DESCRIPTION OF THE PREFERRED EMBODIMENT(S)

Figure 2:
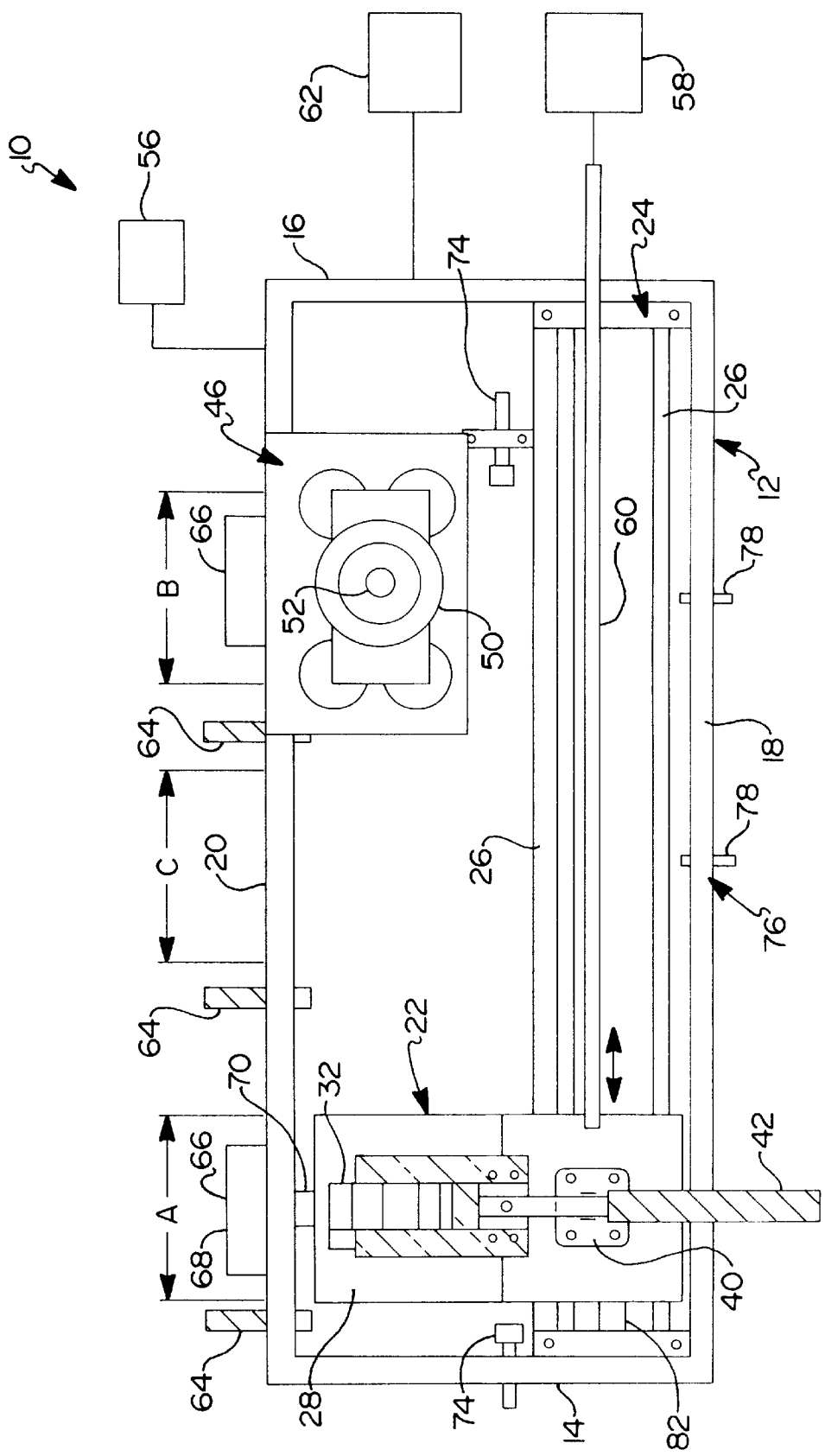
FIG. 2 is a top view of the work holder assembly of FIG. 1.

Referring to FIGS. 1 and 2, one embodiment of a work holder assembly 10, according to the present invention, for bonding wire to an electronic component in a package (not shown, but commonly known in the art), is shown. The package is commonly a plastic package substrate having conductive elements forming a circuit board which supports a semiconductor chip having bare leads. The conductive elements of the circuit board are bonded by gold wire to the bare leads on the semiconductor chip with the work holder assembly 10. The work holder assembly 10 includes a generally rectangular base 12 extending longitudinally between a first end 14 and a second end 16. The base 12 also includes a front wall 18 and a back wall 20 extending between the first and second ends 14, 16.

The work holder assembly 10 further includes a fixture 22 for removably securing the package to the base 12. The fixture 22 is a pedestal seated between the front wall 18 and back wall 20 of the base 12. The work holder assembly 10 includes a linear slide 24 extending between the first end 14 and second end 16 of the base 12. The fixture 22 is coupled to the linear slide 24 and moveable between a wire bonding position, designated at A, and a heating position, designated at B. The fixture 22 is also moveable to a third position defined as a load/unload position and designated at C. The load/unload position C is located midway between the wire bonding position A and the heating position B to allow an operator of the work holder assembly 10 to safety load and unload packages of electronic components to and from the fixture 22 without interfering with the wire bonding or heating of the fixture 22 and package. The linear slide 24 includes a pair of parallel, cylindrical, track rods 26 extending longitudinally between the first end 14 and the second end 16 of the base.

Referring to FIG. 3, the fixture 22 includes a planar fixture base plate 28 extending between the front wall 18 and back wall 20 for supporting the fixture 22 on the base 12. A pair of cylinder bores having inset bearings form a pair of linear slide bearings 30 which are fixedly secured to the bottom of the fixture base plate 28 for receiving the respective pair of track rods 26 therethrough for guiding the fixture 22 along the linear slide 24. The fixture 22 further includes a metal, heated fixture block 32 mounted on the top of the fixture base plate 28 for supporting the package on the fixture 22. The heated fixture block 32 includes a generally V-shaped cavity 34 for receiving the package. It should be appreciated that the heated fixture block 32 may be replaced on the fixture base plate 28 to accommodate different packages of different shape and size. Still further, the fixture 22 includes a thermal insulating block 36 of Bakelite or a phenolic material mounted between the fixture base plate 28 and the heated fixture block 32 for insulating and isolating the heated fixture block 32 from the fixture base plate 28.

The fixture 22 also includes a clamping mechanism 38 for removably securing the package in the cavity 34 of the heated fixture block 32. The clamping mechanism 38 includes a clamp block 40 supported by the fixture base plate 28 and a clamp handle 42 operatively coupled to the clamp block 40 for removably securing the package to the heated fixture block 32 and for opening and closing the cavity 26 to secure the package to the fixture 22. The clamp handle 42 may be actuated manually or automatically, such as by a pneumatic cylinder as shown at 44 in the clamp block 40.

The work holder assembly 10 further includes a gas heater 46 operatively coupled to the base 12 for directing heated gas onto the package in the heating position B. The gas heater 46 is fixedly mounted to the back wall 20 and elevated above the linear slide 24 so as to direct the heated gas downwardly onto the package which is secured to the fixture 22. The gas heater 46 includes a gas supply line 48 for supplying cool gas to a gas heater tank 50. The gas heater tank 50 heats the gas to a predetermined temperature of approximately 400 degrees Celsius. The gas in the preferred embodiment is nitrogen, however, it should be appreciated that the gas could also be air, argon, or the like. The gas heater 46 further includes a gas directing nozzle 52 extending downwardly from the gas heater tank 50 for localizing the heated gas directed from the gas heater tank 50 onto the package which is secured to the fixture 22. The work holder assembly 10 further includes a fixture heater 54 operatively coupled to the fixture 22 for heating the fixture 22 and maintaining the fixture 22 at a predetermined fixture temperature of approximately 140 to 160 degrees Celsius. The fixture heater 54 is a heater rod recessed within the heated fixture block 32.

The work holder assembly 10 includes a first temperature controller 56 operatively connected to the base 12 for actuating the gas heater 46 to direct the heated gas onto the package in the heating position B and a second temperature controller 58 operatively connected to the base 12 actuating the fixture heater 54 and heating the fixture 22 to maintain the predetermined fixture temperature for bonding wire to the electronic component in the package in the wire bonding position A. A flexible wire/cable conduit 60 extends between the second temperature controller 58 and the fixture heater 54 for electrically heating and maintaining the predetermined fixture temperature of the fixture 22 in the wire bonding position A. The first temperature controller 56 is programmable for directing the heated gas onto the package secured in the fixture 22 in the heating position B at a predetermined temperature of approximately 400 degrees Celsius. The second temperature controller 58 is also programmable to heat the fixture block 32 in the wire bonding position A and maintain a predetermined temperature of approximately 140 to 160 degrees Celsius in the fixture 22.

The work holder assembly 10 includes a programmable logic controller (PLC) 62 operatively coupled to the base 12 for automatically moving the fixture 22 along the linear slide 24 between the wire bonding position A, the heating position B, and the load/unload position C and for maintaining the fixture 22 in each of the wire bonding position A and heating position B for a respective predetermined period of time.

That is, the PLC 62 maintains the fixture 22 in the heating position B, under the gas heater 46 directing heated gas onto the package at approximately 400 degrees Celsius for approximately 30 to 45 seconds.

More specifically, referring to FIG. 2, a proximity sensor 64 is connected to the back wall 20 of the base 12 adjacent each of the wire bonding position A, the heating position B, and the load/unload position C. Each proximity sensor 64 senses the presence of the fixture 22 along the linear slide 24 in each of the wire bonding position A, heating position B, and load/unload position C and transmits an electrical signal to the PLC 62 identifying the sensed position. A locking mechanism 66 is also connected to the back wall 20 of the base 12 for locking the fixture 22 in the base 12 along the linear slide 24 for the predetermined periods of time in each of the respective wire bonding position A and heating position B. A locking mechanism 66 is located in the center position of each of the wire bonding position A and the heating position B and includes a pneumatic cylinder 68 for actuating a locking shaft 70 transverse to the longitudinal axis extending between the first end 14 and second end 16 of the base 12. The locking shaft 70 is lockably received in an aperture 72 in the fixture base plate 28 as shown in FIGS. 2 and 3.

The work holder assembly 10 also includes a fixture stop 74 mounted to the base 12 adjacent each of the first and second ends 14, 16 for abutting and stopping the fixture 22 along the linear slide 24 in each of the heating position B and the wire bonding position A. The fixture stop 74 is a plunger-type rod mounted to the base 12 to abut and stop the fixture 22 in each position. The work holder assembly 10 additionally includes a detent mechanism 76 coupled to the front wall 18 of the base 12 for locating and aligning the fixture 22 along the linear slide 24 in each of the heating position B, wire bonding position A, and load/unload position C. The detent mechanism 76 includes a retractable pin 78 mounted to the front wall 18 of the base 12 which is received in an aperture 80 in the lower portion of the fixture base plate 28 to engage with the aperture 80 and detent the fixture 22 in each of the heating position B, wire bonding position A, and load/unload position C.

In operation, an electronic component, such as an engine sensor module, mounted in a package, is seated in the cavity 34 of the heated fixture block 32. The clamp mechanism 38 is closed by the clamp handle 42 to secure the package to the fixture block 32 in the load/unload position C. The fixture 22 may now be moved along the linear slide 24, either manually or automatically by a pneumatic piston/cylinder 82, controlled by the PLC 62, from the load/unload position C to the heating position B. The fixture 22 is stopped in the heating position B by the fixture stop 74 and detent mechanism 76. Once the proximity sensor 64 senses the presence of the fixture 22 in the heating position B, a signal is transmitted to the PLC 62 and the locking mechanism 66 is actuated wherein the pneumatic cylinder 68 forces the locking shaft 70 into the aperture 72 to lock the fixture 22 in the heating position B. Once the fixture 22 is locked in the heating position B, the gas heater 46 directs heated nitrogen gas from the gas heater tank 50 through the gas directing nozzle 52 onto the package. The gas heater 46 directs the heated gas onto the package at a temperature of approximately 400 degrees Celsius. The temperature of the gas in the gas heater 46 is monitored by a thermocouple (not shown) mounted to the gas heater tank 50. The gas heater 46 is always actuated by the first temperature controller 56 whether or not the fixture 22 is in the heating position B. The PLC 62 maintains the fixture 22 in the heating position B for a predetermined amount of heating time of approximately 30 to 45 seconds. After the predetermined period of heating time has expired, the fixture 22 is unlocked by the locking mechanism 66 and moved along the linear slide 24 from the heating position B to the wire bonding position A. The fixture 22 is again abutted and stopped in the wire bonding position A by the fixture stop 50 and detent mechanism 76. Once the proximity sensor 64 senses the presence of the fixture 22 in the wire bonding position A, a signal is transmitted to the PLC 62 and the locking mechanism 66 is actuated wherein the pneumatic cylinder 68 forces the locking shaft 70 into the aperture 72 to lock the fixture 22 in the wire bonding position A. The second temperature controller 58 continuously heats the fixture 22 via the electrical wire/cable conduit 60 to maintain a predetermined fixture temperature of approximately 140 to 160 degrees Celsius during the wire bonding process. The temperature in the heated fixture block 32 is monitored by a thermocouple (not shown) mounted in the heated fixture block 32. The wire bonding process is a process commonly known in the art of bonding wire, such as gold wire, between electrical interconnects on a semiconductor electronic component and surrounding lead frame pads molded into the package. The second temperature controller 58 maintains the temperature of the fixture 22, and thus the package, during the entire wire bonding process. Once the wire bonding process is completed, the fixture 22 is unlocked by the locking mechanism 66 and moved along the linear slide 24 from the wire bonding position A to the load/unload position C for unloading of the wire bonded package and loading of a new package for the heating and wire bonding process.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A work holder assembly for bonding wire to an electronic component in a package, said work holder assembly comprising:
    a base extending longitudinally between a first end and a second end;
    a fixture for removably securing the package to said base;
    a linear slide extending between said first end and said second end of said base, said fixture coupled to said linear slide and moveable between a wire bonding position and a heating position;
    a gas heater operatively coupled to said base for directing heated gas onto the package in said heating position;
    a fixture heater operatively coupled to said fixture for heating and maintaining said fixture at a predetermined fixture temperature;
    a first temperature controller operatively connected to said base for actuating said gas heater to direct said heated gas onto the package in said heating position; and
    a second temperature controller operatively connected to said base for actuating said fixture heater and heating said fixture to said predetermined fixture temperature for bonding wire to the electronic component in the package in said wire bonding position.

2. The work holder assembly as set forth in claim 1 including a programmable logic controller operatively coupled to said base for automatically moving said fixture along said linear slide between said heating position and said wire bonding position and for maintaining said fixture in each of said heating position and said wire bonding position for a predetermined period of time.

3. The work holder assembly as set forth in claim 2 including a proximity sensor connected to said base for sensing the presence of said fixture along said linear slide in each of said wire bonding position, said heating position and a load/unload position located between said wire bonding position and said heating position.

4. The work holder assembly as set forth in claim 3 including a locking mechanism coupled to said base for locking said fixture to said base along said linear slide for said predetermined period of time in each of said heating position and said wire bonding position.

5. The work holder assembly as set forth in claim 4 including a fixture stop mounted to said base for abutting and stopping said fixture along said linear slide at each of said heating position and said wire bonding position.

6. The work holder assembly as set forth in claim 5 including a detent mechanism for locating and aligning said fixture along said linear slide in each of said wire bonding position, said heating position and said load/unload position.

7. The work holder assembly as set forth in claim 6 wherein said gas heater includes a gas supply line for supplying cool gas to a gas heater tank and a gas directing nozzle for localizing said gas directed from said gas heater tank onto the package.

8. The work holder assembly as set forth in claim 1 wherein said fixture includes a fixture base plate for supporting said fixture on said linear slide, a pair of linear slide bearings connected to said fixture base plate for guiding said fixture along said linear slide, and a heated fixture block mounted on said fixture base plate for supporting the package.

9. The work holder assembly as set forth in claim 8 wherein said fixture includes an insulating block mounted between said fixture base plate and said heated fixture block for insulating said heated fixture block from said fixture base plate.

10. The work holder assembly as set forth in claim 9 wherein said fixture includes a clamping mechanism for removably securing the package to said heated fixture block.

11. The work holder assembly as set forth in claim 10 wherein said clamping mechanism includes a clamp block supported by said fixture base plate and a clamp handle operatively coupled to said clamp block for removable securing the package to said fixture block.

12. The work holder assembly for bonding wire to an electronic component in a package, said work holder assembly comprising:
    a base extending longitudinally between a first end and a second end;
    a fixture for removably securing the package to said base;
    a linear slide extending between said first end and said second end of said base, said fixture coupled to said linear slide and moveable between a wire bonding position and a heating position;
    a gas heater operatively coupled to said base for directing heated gas onto the package in said heating position;
    a fixture heater operatively coupled to said fixture for heating and maintaining said fixture at a predetermined fixture temperature;
    said fixture including a fixture base plate for supporting said fixture on said linear slide, a pair of linear slide bearings connected to said fixture base plate for guiding said fixture along said linear slide between said heating position and said wire bonding position, and a heated fixture block mounted on said fixture base plate for supporting the package;

a first temperature controller operatively connected to said base for actuating said gas heater to direct said heated gas onto the package in said heating position for a predetermined period of time at a predetermined temperature;

a second temperature controller operatively connected to said base actuating said fixture heater and heating said fixture to maintain said predetermined fixture temperature for bonding wire to the electronic component in the package in said wire bonding position; and a programmable logic controller operatively connected to said base for automatically moving said fixture along said linear slide between said heating position and said wire bonding position and for maintaining said fixture in each of said heating position and said wire bonding position for a predetermined period of time.

13. The work holder assembly as set forth in claim 12 including a proximity sensor connected to said base for sensing the presence of said fixture along said linear slide in each of said wire bonding position, said heating position and a load/unload position located between said wire bonding position and said heating position.

14. The work holder assembly as set forth in claim 13 including a locking mechanism coupled to said base for locking said fixture to said base along said linear slide for said predetermined period of time in each of said heating position and said wire bonding position.

15. The work holder assembly as set forth in claim 14 including a fixture stop mounted to said base for abutting and stopping said fixture along said linear slide at each of said heating position and said wire bonding position.

16. The work holder assembly as set forth in claim 15 including a detent mechanism for locating and aligning said fixture along said linear slide in each of said wire bonding position, said heating position and said load/unload position.

17. The work holder assembly as set forth in claim 16 wherein said gas heater includes a gas supply line for supplying cool gas to a gas heater tank and a gas directing nozzle for localizing said gas directed from said gas heater tank onto the package.

\* \* \* \* \*